(12) United States Patent
Ding et al.

(10) Patent No.: US 10,490,669 B2
(45) Date of Patent: Nov. 26, 2019

(54) THIN FILM TRANSISTOR, MANUFACTURING METHOD, ARRAY SUBSTRATE, DISPLAY PANEL, AND DEVICE

(71) Applicants: BOE TECHNOLOGY GROUP CO., LTD., Beijing (CN); Hefei Xinsheng Optoelectronics Technology Co., Ltd., Anhui (CN)

(72) Inventors: Yuankui Ding, Beijing (CN); Ce Zhao, Beijing (CN); Guangcai Yuan, Beijing (CN); Yingbin Hu, Beijing (CN); Leilei Cheng, Beijing (CN); Jun Cheng, Beijing (CN); Bin Zhou, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/992,909

(22) Filed: May 30, 2018

(65) Prior Publication Data
US 2019/0172953 A1 Jun. 6, 2019

(30) Foreign Application Priority Data
Dec. 6, 2017 (CN) .......................... 2017 1 1274716

(51) Int. Cl.
*H01L 29/786* (2006.01)
*H01L 27/12* (2006.01)
*H01L 29/66* (2006.01)

(52) U.S. Cl.
CPC ...... *H01L 29/78618* (2013.01); *H01L 27/127* (2013.01); *H01L 27/1225* (2013.01); *H01L 27/1288* (2013.01); *H01L 29/66969* (2013.01); *H01L 29/7869* (2013.01)

(58) Field of Classification Search
None
See application file for complete search history.

(56) References Cited

U.S. PATENT DOCUMENTS

2013/0175534 A1* 7/2013 Chung ................ H01L 27/1218
257/66
2015/0108468 A1* 4/2015 Cheon ................ H01L 21/02554
257/43

* cited by examiner

*Primary Examiner* — Whitney Moore
(74) *Attorney, Agent, or Firm* — Calfee, Halter & Griswold LLP

(57) ABSTRACT

The present disclosure discloses a TFT, a manufacturing method, an array substrate, a display panel, and a device. The TFT includes a hydrogen-containing buffer layer located on a substrate; an oxide semiconductor layer located on the buffer layer, wherein the oxide semiconductor layer includes a conductor region and a semiconductor region; a source or drain located on the conductor region, and electrically connected to the conductor region; and a gate structure located on the semiconductor region.

9 Claims, 8 Drawing Sheets

THIN FILM TRANSISTOR, MANUFACTURING METHOD, ARRAY SUBSTRATE, DISPLAY PANEL, AND DEVICE

CROSS REFERENCE

The present application claims the priority of Chinese Patent Application No. 201711274716.0, filed on Dec. 6, 2017, and the entire contents thereof are incorporated herein by reference as part of the present application.

TECHNICAL FIELD

The present disclosure relates to the field of display panel technology, and more particularly, to a thin film transistor, a manufacturing method thereof, an array substrate, a display panel, and a device.

BACKGROUND

With the increasing size of displays, amorphous silicon thin film transistors have problems of insufficient electron mobility and poor homogeneity. In order to solve the above-described problems, the technology of using an oxide semiconductor material such as IGZO to replace amorphous silicon has emerged. In order to guarantee excellent contact between a source and drain (S/D) in a TFT (Thin Film Transistor) and IGZO, it needs to metallize a contact interface between the IGZO and the S/D in a manufacturing process.

It should be noted that, information disclosed in the above background portion is provided only for better understanding of the background of the present disclosure, and thus it may contain information that does not form the prior art known by those ordinary skilled in the art.

SUMMARY

One aspect of the present disclosure provides a thin film transistor (TFT) including:

a substrate;

a hydrogen-containing buffer layer, located on the substrate;

an oxide semiconductor layer, located on the buffer layer, wherein the oxide semiconductor layer includes a conductor region and a semiconductor region;

a source or drain, located on the conductor region, the source or drain being electrically connected to the conductor region; and a gate structure, located on the semiconductor region.

In an optional embodiment, the TFT further includes: a blocking layer, formed between the buffer layer and the semiconductor region, and the blocking layer blocks hydrogen in the buffer layer from entering into the semiconductor region.

In another optional embodiment, the TFT further includes: a blocking layer formed between the buffer layer and the semiconductor region, and the blocking layer blocks hydrogen in the buffer layer from entering into the semiconductor region.

In yet another optional embodiment, the hydrogen-containing buffer layer includes a first hydrogen-containing region corresponding to the conductor region and a second hydrogen-free region corresponding to the semiconductor region.

Another aspect of the present disclosure provides a method for manufacturing a TFT, including: forming a hydrogen-containing buffer layer on a substrate; forming an oxide semiconductor layer on the buffer layer; and allowing hydrogen in the buffer layer to enter into a portion of the oxide semiconductor layer such that the oxide semiconductor layer is plasmon activated, the plasmon generated oxide semiconductor layer being formed as a conductor region, and the plasmon non-generated oxide semiconductor layer being formed as a semiconductor region; forming a source or drain on the conductor region, the source or drain being electrically connected to the conductor region; and forming a gate structure on the semiconductor region.

In an optional embodiment, before the oxide semiconductor layer is formed, the method further includes: forming a patterned blocking layer on the buffer layer, wherein the blocking layer blocks hydrogen in the buffer layer from entering into the oxide semiconductor layer.

In another optional embodiment, the forming a hydrogen-containing buffer layer on a substrate includes: forming a hydrogen-free buffer layer on the substrate; forming a patterned photoresist on the hydrogen-free buffer layer; performing a hydrogen injection treatment on the buffer layer which is not covered by the photoresist to obtain a first hydrogen-containing region, the buffer layer covered by the photoresist being formed as a second hydrogen-free region; and removing the photoresist.

In another optional embodiment, the forming a hydrogen-containing buffer layer on a substrate includes: forming a hydrogen-free material layer on the substrate; forming an opening in the hydrogen-free material layer to expose the substrate; forming a hydrogen-containing material layer in the opening; planarizing such that surfaces away from the substrate of the hydrogen-free material layer and the hydrogen-containing material layer are aligned with each other, wherein the hydrogen-containing material layer is formed as a first region, and the hydrogen-free material layer is formed into a second region.

In yet another optional embodiment, a content of hydrogen in the buffer layer is selected based on a thickness of the oxide semiconductor layer.

In yet another optional embodiment, allowing hydrogen in the buffer layer to enter into a portion of the oxide semiconductor layer such that the oxide semiconductor layer is plasmon activated comprises thermal treating the buffer layer.

Another aspect of the present disclosure provides an array substrate including the TFT in the above-described aspect.

Another aspect of the present disclosure provides a display panel including the array substrate in the above-described aspect.

Another aspect of the present disclosure provides a display device including the display panel in the above-described aspect.

BRIEF DESCRIPTION OF THE DRAWINGS

Specific implementation manners of the present disclosure will be further described in detail below with reference to the accompanying drawings.

DETAILED DESCRIPTION

Figure 1:
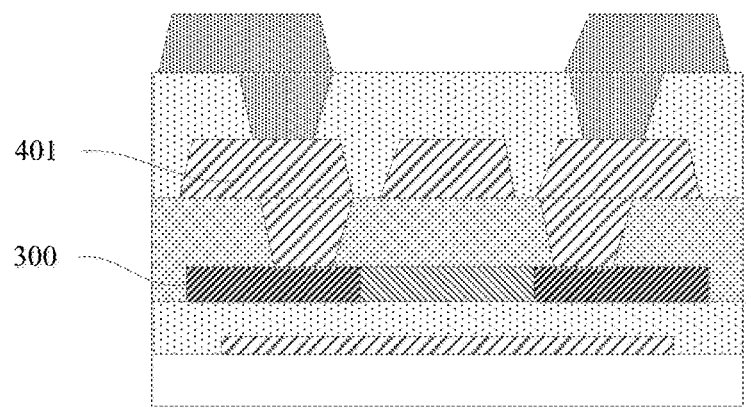
FIG. 1 is a schematic diagram illustrating a top-gate TFT, which uses IGZO as an active layer material.

In order to more clearly illustrate the present disclosure, the present disclosure will be further described below in conjunction with the optional embodiments and the accompanying drawings. Like parts throughout the drawings are denoted by the same reference numerals. It should be understood by those skilled in the art that the contents described in detail below are illustrative rather than restrictive, and should not limit the protection scope of the present disclosure.

Various cross-sectional views according to embodiments of the present disclosure are illustrated in the drawings. These drawings are not drawn to scale and some of the details are exaggerated for clarity of presentation and some details may have been omitted. Shapes of various regions and layers shown in the drawings and relative sizes and positional relationships between them are merely exemplary, and may actually be deviated due to manufacturing tolerances or technical limitations, and those skilled in the art can additionally design regions/layers with different shapes, sizes, relative positions based on the actual needs.

In a display panel as shown in FIG. 1 (taking a TFT having a top gate structure as an example), indium gallium zinc oxide (IGZO) is used as a channel material, an IGZO layer 300 is in metal contact with a source or drain (S/D) 401. In order to reduce a channel length to increase an ON-current (Ion) and simultaneously reduce a contact resistance, the above-described objective is achieved generally by adopting a method for metalizing (conductoring) a contact region between the IGZO layer 300 and the source or drain (S/D) 401.

Figure 2:
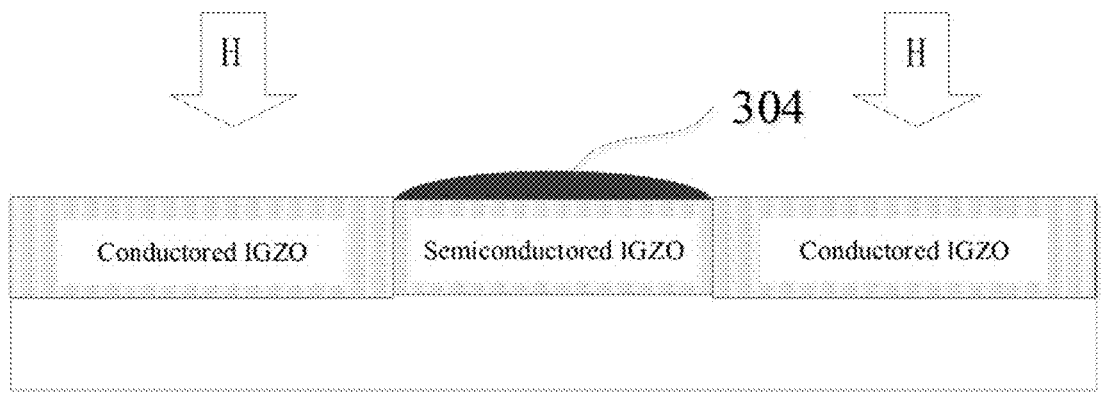
FIG. 2 is a schematic diagram illustrating metallization of IGZO.

With regard to the method for metallizing IGZO, as shown in FIG. 2, a photoresist (PR) 304 is used to cover an IGZO region that needs to retain semiconductor characteristics, and Ar gas or He gas plasma is used in a dry etching device to bombard an exposed region, and a possible principle is to use a bombardment force of ions to break a metal-O bond in IGZO to achieve the purpose of metallization.

Though a plasma bombardment method is simple to operate, it has many limitations. First, a surface of the exposed IGZO region becomes rough because of plasma bombardment, it is not beneficial for metal contact with the source or drain (S/D). Secondly, plasma bombardment is affected by a thickness of IGZO, and the metallization effect of a deep IGZO is poor. Finally, in a subsequent IGZO thermal process, deoxidized IGZO will be heated and recombined with O molecules in the air to form a semiconductor.

In one of the present disclosure, with reference to FIGS. 3 and 4-9, a method 10 for fabricating a TFT is provided. The method includes the following steps.

Figure 4:
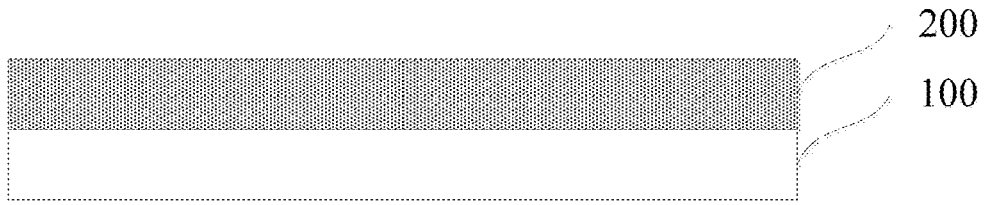
FIGS. 4 to 9 are cross-sectional views showing the TFT in respective steps in FIG. 3.

In S101, a hydrogen-containing buffer layer 200 is formed on a substrate 100, as shown in FIG. 4.

Optionally, a material of the buffer layer 200 is hydrogen-containing silicon nitride (SiNx) or silicon oxide (SiOx).

It is apparent to those skilled in the art that, for example, silicon nitride (SiNx) or silicon oxide (SiOx) can be make hydrogen-rich by injecting hydrogen.

Figure 5:
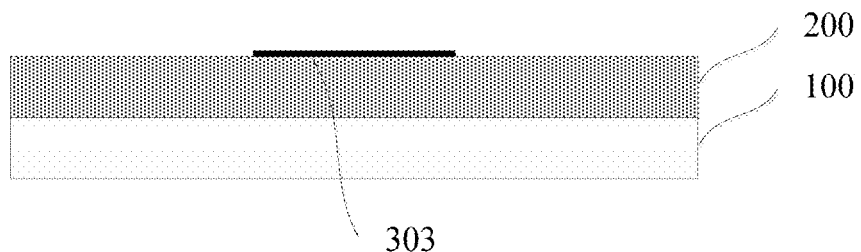

In S102, a patterned blocking layer 303 is formed on the buffer layer 200, as shown in FIG. 5.

Optionally, a material of the blocking layer 303 includes silicon nitride (SiNx) or silicon oxide (SiOx). However, it should be noted that the material of the blocking layer is different from the material of the buffer layer and does not contain hydrogen, that is to say, when the material of the buffer layer 200 includes SiNx, the material of the blocking layer 303 includes SiOx, or when the material of the buffer layer 200 includes SiOx, the material of the blocking layer 303 includes SiNx.

Figure 6:
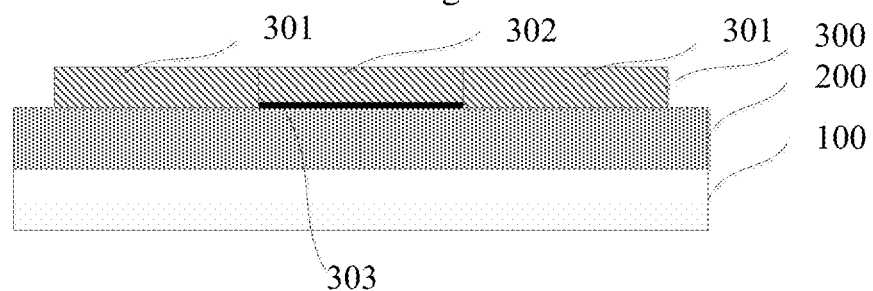

In S103, an oxide semiconductor layer 300 is formed on the buffer layer 200 and the blocking layer 303, as shown in FIG. 6.

Optionally, the oxide semiconductor layer 300 is made of a material such as IGZO or ITZO. Taking IGZO as an example, in its manufacturing process, physical vapor deposition method or laser pulse deposition method may be employed, followed by exposure, development, etching, and stripping processes to obtain a patterned IGZO layer covering the buffer layer 200 and the blocking layer 303.

Figure 7:
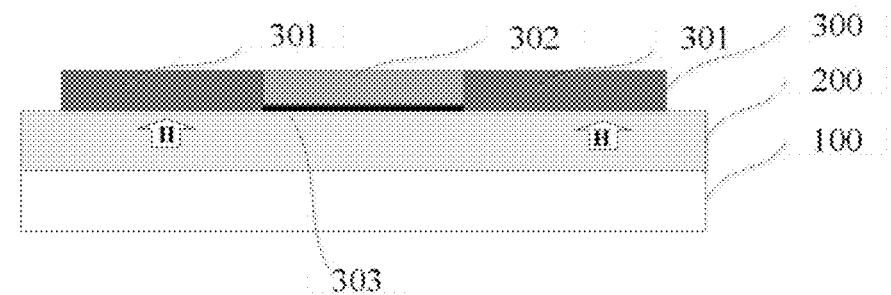

In S104, hydrogen in the buffer layer 200 enters into a portion of the oxide semiconductor layer 300 such that the oxide semiconductor layer 300 is plasmon activated, as shown in FIG. 7.

Wherein a manner for processing the plasmon activation may be a thermal treatment or the like, taking the thermal treatment for an example, because the blocking layer 303 blocks hydrogen from entering into the oxide semiconductor layer 300, in a process of the thermal treatment, hydrogen in the buffer layer 200 which is not blocked enters into the oxide semiconductor layer 300 such that the portion of oxide semiconductor layer 300 is conductored to form a conductor region 301, and a portion of oxide semiconductor layer 300 with no hydrogen entered is formed into a semiconductor region 302. In the present disclosure, the portion of oxide semiconductor layer 300 being conductored may refer to the physical phenomenon that the portion of oxide semiconductor layer 300 becomes a conductor. Similarly, term "semiconductored" may refer to the physical phenomenon that the portion of oxide semiconductor layer 300 becomes or remains a semiconductor.

Figure 8:
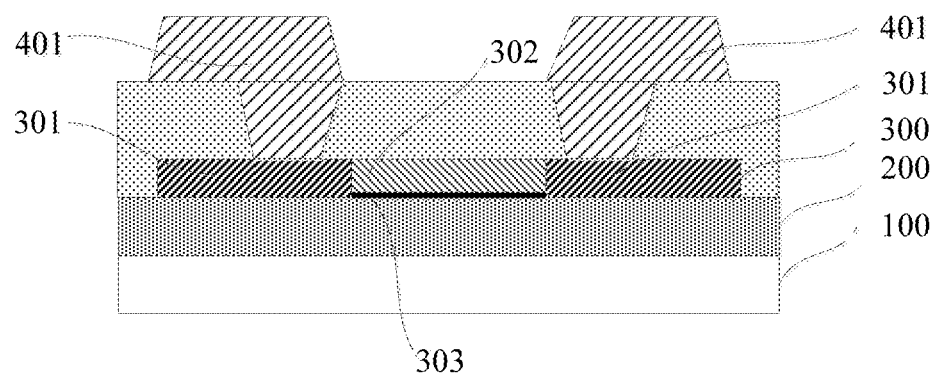

In S105, a source or drain 401 is formed on the conductor region 301, as shown in FIG. 8.

The source or drain 401 is formed to be electrically connected to the two conductor regions 301 described above.

Figure 9:
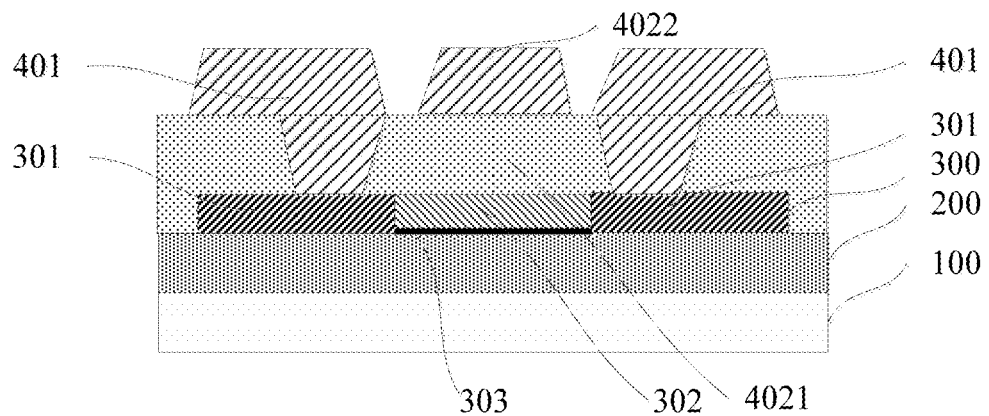

In S106, a gate structure is formed on the semiconductor region 302, as shown in FIG. 9.

The gate structure is formed as corresponding to the semiconductor region 302 described above, and it is apparent to those skilled in the art that the gate structure includes a gate insulating layer 4021 and a gate 4022 on the gate insulating layer 4021.

Figure 3:
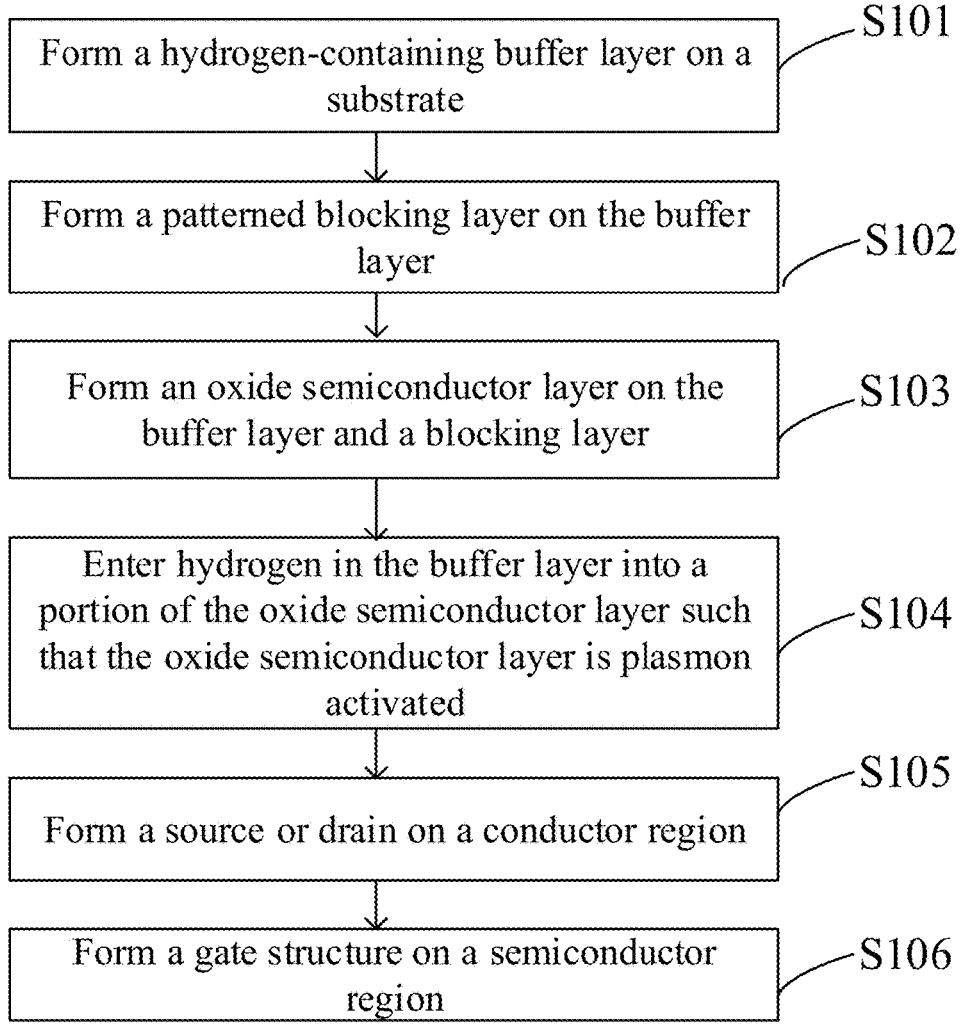
FIG. 3 is a flowchart showing a method for manufacturing a TFT in one aspect of the present disclosure.

Of course, it is apparent to those skilled in the art that the source and drain 401 and the gate structure may be formed after the step of the thermal treatment, or before the step of the thermal treatment, that is to say, the step S104 is performed after the step S106 in FIG. 3. More generally, the steps of the method provided by the embodiments of the present disclosure may not be implemented in the order given in the figures without violating logic, and the present disclosure does not impose any limitation thereon.

Figure 10:
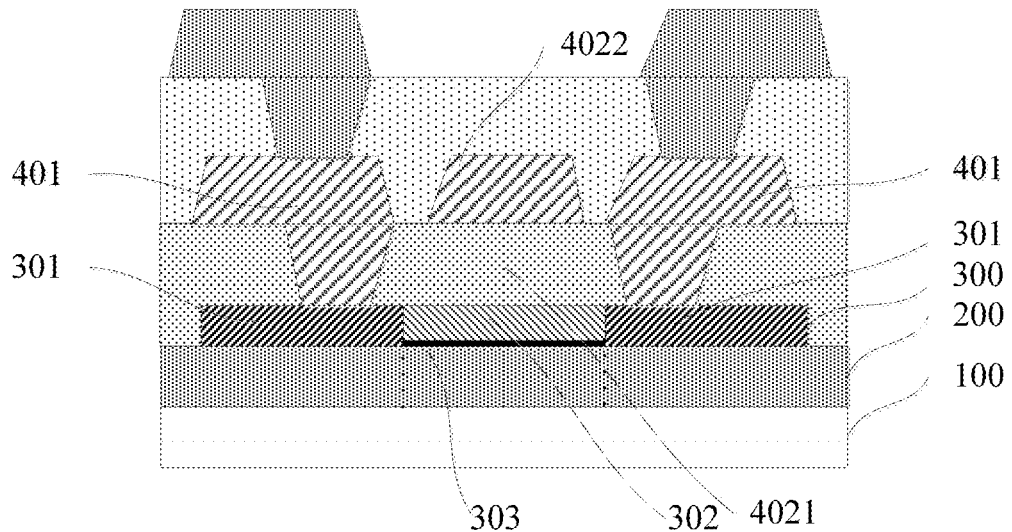
FIG. 10 is a cross-sectional view showing the TFT in one aspect of the present disclosure.

After the above-described process steps, a TFT as shown in FIG. 10 is obtained, including:

a hydrogen-containing buffer layer 200 formed on a substrate 100;

a blocking layer 303 formed on the buffer layer 200;

an oxide semiconductor layer 300 formed on the buffer layer 200 and the blocking layer 303, and including a conductor region and a semiconductor region;

a source or drain 401 formed on the conductor region 302, and electrically connected to the conductor region 301; and a gate structure formed on the semiconductor region.

The present disclosure has a simple manufacturing process, and avoids, in the manufacturing process, problems of surface defect of the oxide semiconductor layer caused by plasma bombardment and of re-semiconducting the portion of the oxide semiconductor layer having the conductor characteristics due to subsequent thermal treatment process.

Optionally, in the method of this aspect, a content of hydrogen injected into the buffer layer 200 may be selected according to a thickness of the oxide semiconductor layer 300 that needs to be conductored.

The content of hydrogen is adjusted to be adapted to the oxide semiconductor layer 300 having different film thicknesses, such that the degree of conductoring is controllable.

Optionally, the method further includes: forming a light shielding layer on the substrate 100 before forming the buffer layer 200 to prevent light from entering the TFT from the bottom. In its manufacturing process, physical vapor deposition method or laser pulse deposition method may be employed, followed by exposure, development, etching, and stripping processes to obtain a patterned light shielding layer covering the buffer layer, which will not be elaborated in the present disclosure.

However, in one of the present disclosure, the presence of the blocking layer 303 makes corners of the blocking layer 303 in contact with the oxide semiconductor layer 300 easily loose, so that the corners of the blocking layer 303 in contact with the oxide semiconductor layer 300 easily split, this problem is referred to as "segment gap".

Figure 11:
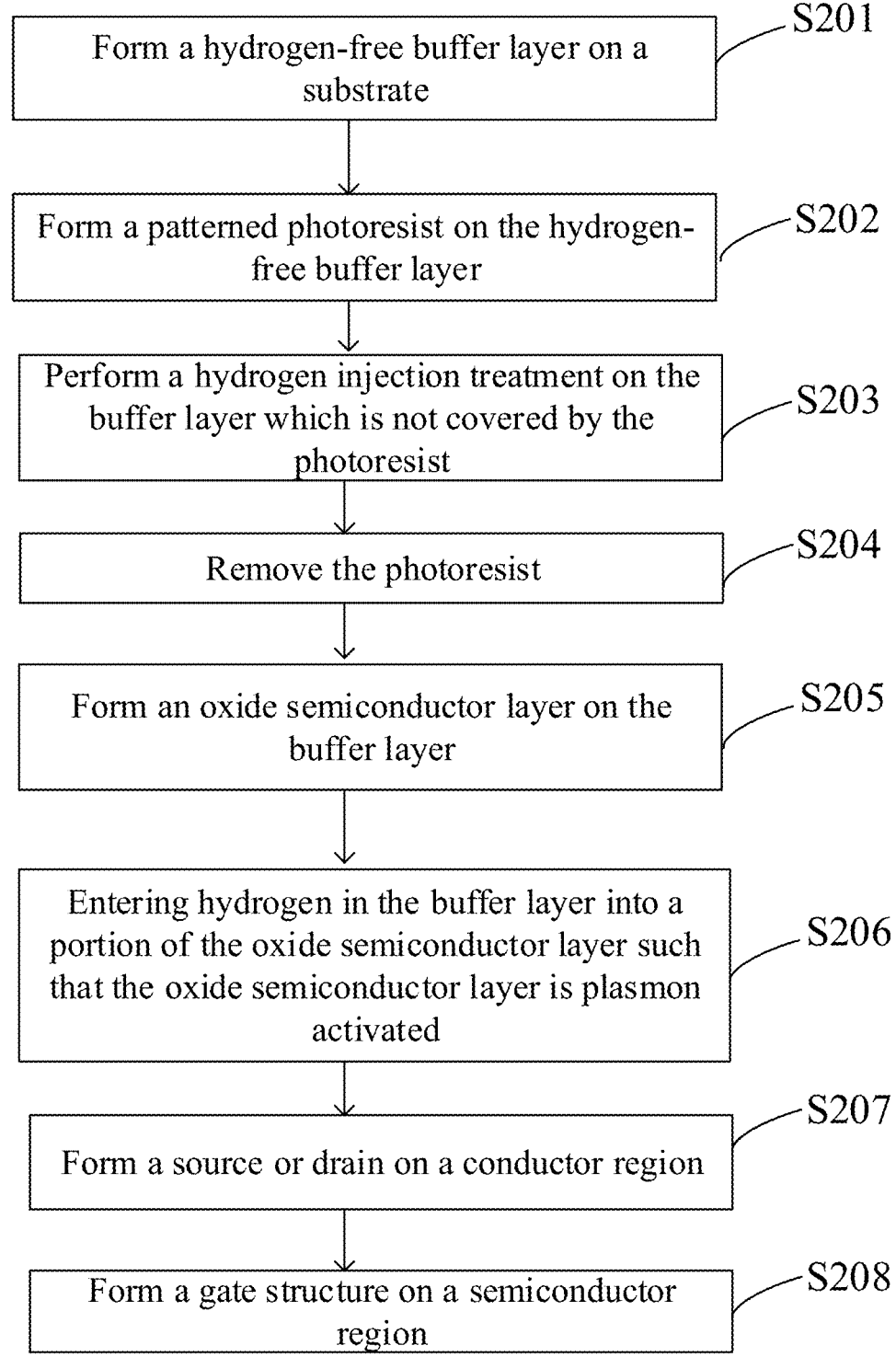
FIG. 11 is a flow chart showing a method for manufacturing a TFT in one aspect of the present disclosure.
Figure 12:
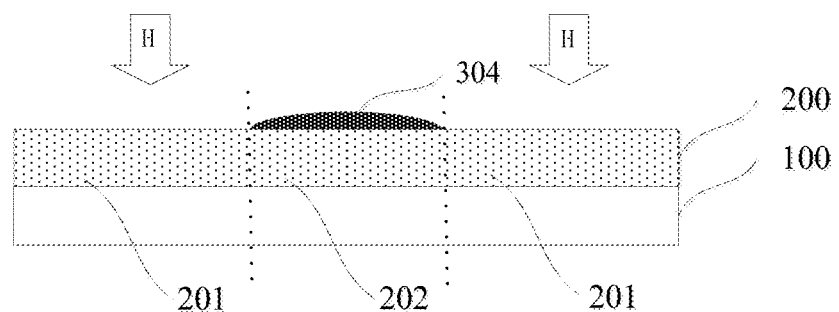
FIG. 12 is a cross-sectional view showing the TFT in step S203 of FIG. 11.

Therefore, in one of the present disclosure, a method 20 for fabricating a TFT is provided. As shown in FIGS. 11 and 12, the method includes the following steps.

In S201, a hydrogen-free buffer layer is formed on a substrate.

Optionally, a material of the buffer layer includes silicon nitride (SiNx) or silicon oxide (SiOx).

In S202, a patterned photoresist is formed on the hydrogen-free buffer layer.

In S203, a hydrogen injection treatment is performed on the buffer layer which is not covered by the photoresist 304 to obtain a first hydrogen-containing region 201, as shown in FIG. 12, the buffer layer covered by the photoresist being formed as a second hydrogen-free region 202.

In S204, the photoresist is removed.

In S205, an oxide semiconductor layer is formed on the buffer layer.

Optionally, the oxide semiconductor layer is made of a material such as IGZO or ITZO. Taking IGZO as an example, in its manufacturing process, physical vapor deposition method or laser pulse deposition method may be employed, followed by exposure, development, etching, and stripping processes to obtain a patterned IGZO layer covering the buffer layer and the blocking layer.

In S206, hydrogen in the buffer layer is entering into a portion of the oxide semiconductor layer such that the oxide semiconductor layer is plasmon activated.

Taking a thermal treatment as an example, because the photoresist blocks the injection of hydrogen, hydrogen is only present in a first region, hydrogen in the first region enters into the oxide semiconductor layer during the thermal treatment for plasmon activation of the oxide semiconductor layer so as to form a conductor region, and the portion of the oxide semiconductor layer that is not plasmon activated is formed as a semiconductor region.

In S207, a source or drain is formed on the conductor region.

The source or drain is formed to be electrically connected to the conductor region.

In S208, a gate structure is formed on the semiconductor region.

Those skilled in the art understand that the gate structure includes a gate and a gate insulating layer.

Of course, it is apparent to those skilled in the art that the source and drain and the gate structure may be formed after the step of the thermal treatment, or before the step of the thermal treatment, that is to say, the step S206 is performed after the step S208 in FIG. 11. More generally, the steps of the method provided by the embodiments of the present disclosure may not be implemented in the order given in the figures without violating logic, and the present disclosure does not impose any limitation thereon.

Figure 13:
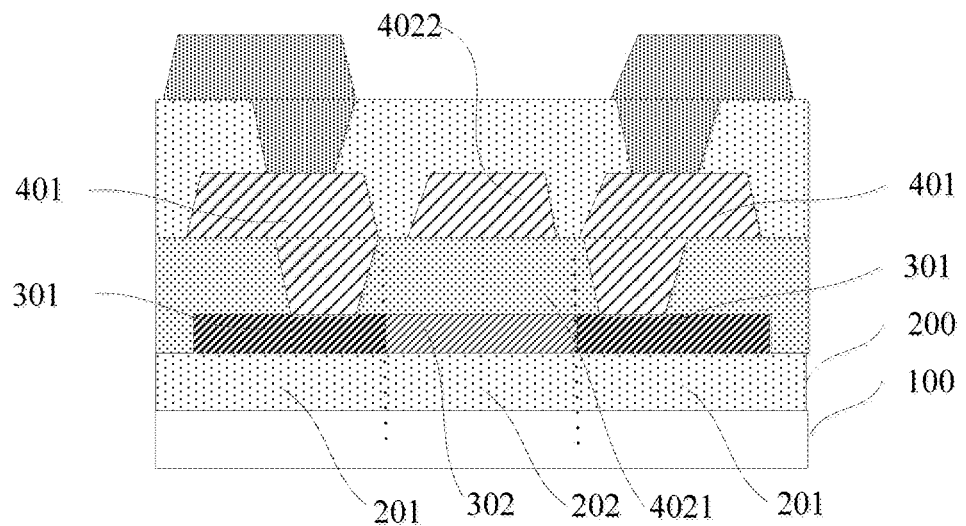
FIG. 13 is a cross-sectional view showing the TFT in one aspect of the present disclosure.

After the above-described process steps, a TFT as shown in FIG. 13 is obtained, including:

a hydrogen-containing buffer layer 200 formed on a substrate 100;

an oxide semiconductor layer 300 formed on the buffer layer 200, and including a conductor region 301 and a semiconductor region 302;

a source or drain 401 formed on the conductor region 302, and electrically connected to the conductor region 301; and a gate structure formed on the semiconductor region 302.

a hydrogen-containing buffer layer 200 including a first hydrogen-containing region 201 corresponding to the conductor region 301 and a second hydrogen-free region 202 corresponding to the semiconductor region 302.

Optionally, a material of the buffer layer 200 includes SiOx.

Compared to the above aspect of the present disclosure, the photoresist 304 can be removed in the subsequent processes, thereby reducing the number of steps of forming the blocking layer, simplifying the process flows, and avoiding the problem of the segment gap caused by the presence of the blocking layer, in this way, the TFT is more stable and has a better conductor effect.

However, in the TFT and the manufacturing method thereof in this aspect, hydrogen is easily diffused in the same material after hydrogen-loading of the buffer layer 200, and a situation of an insufficient amount of hydrogen injected may occur, this causes that the conductoring of the oxide semiconductor layer corresponding to the first region is not thorough, which affects performance of the semiconductor device.

Figure 14:
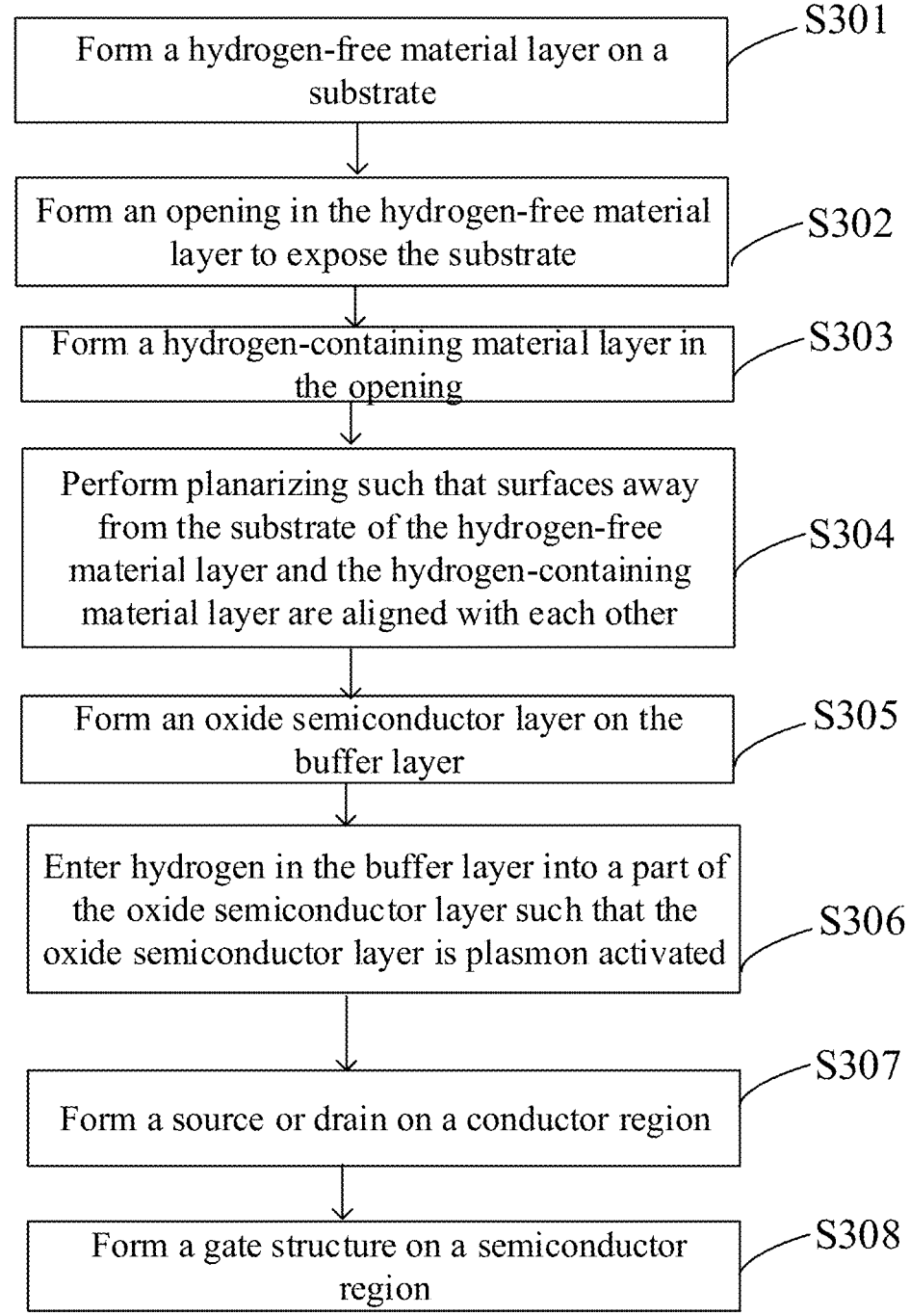
FIG. 14 is a flowchart showing a method for manufacturing a TFT in one aspect of the present disclosure.

Therefore, in order to solve the problems in the previous aspect, in a third aspect of the present disclosure, a method 30 for manufacturing a TFT is provided. As shown in FIG. 14, the method includes the following steps.

In S301, a hydrogen-free material layer is formed on a substrate.

In S302, an opening is formed in the hydrogen-free material layer to expose the substrate.

Taking SiOx as an example, the opening is formed in a SiOx material layer by a mask process and a vapor deposition method or other alternative methods, and the opening exposes the substrate portion.

In S303, a hydrogen-containing material layer is formed in the opening.

Optionally, the hydrogen-containing material layer is a hydrogen-containing SiNx layer. Taking SiNx for an example, a SiNx material layer is formed in the opening through a mask process and a deposition manner.

In S304, planarizing is performed such that surfaces away from the substrate of the hydrogen-free material layer and the hydrogen-containing material layer are aligned with each other, wherein the hydrogen-containing material layer is formed as a second region, and the hydrogen-free material layer is formed as a first region.

The method for planarization may be dry etching or other conventional methods in the art, and the disclosure is not limited thereto.

In S305, an oxide semiconductor layer is formed on the buffer layer.

This step is the same as S205 in one of the present disclosure, which will not be described herein.

In S306, hydrogen in the buffer layer enters into a part of the oxide semiconductor layer such that the oxide semiconductor layer is plasmon activated.

During the thermal treatment, hydrogen in the first hydrogen-containing region enters into the oxide semiconductor layer, so that the corresponding oxide semiconductor layer is plasmon activated, and this portion of oxide semiconductor layer is formed into a conductor region, and the second hydrogen-free region has no hydrogen entering into the oxide semiconductor layer, and therefore the corresponding oxide semiconductor layer cannot be plasmon activated during the thermal treatment, thus the portion of oxide semiconductor layer is formed into a semiconductor region.

In S307, a source or drain is formed on the conductor region.

The source or drain is electrically connected to the conductor region.

In S308, a gate structure is formed on the semiconductor region.

It is apparent to those skilled in the art that the gate structure includes a gate and a gate insulating layer.

Of course, it is apparent to those skilled in the art that the source and drain and the gate structure may be formed after the step of the thermal treatment, or before the step of the thermal treatment, that is to say, the step S306 is performed after the step S308 in FIG. 14. More generally, the steps of the method provided by the embodiments of the present disclosure may not be implemented in the order given in the figures without violating logic, and the present disclosure does not impose any limitation thereon.

Figure 15:
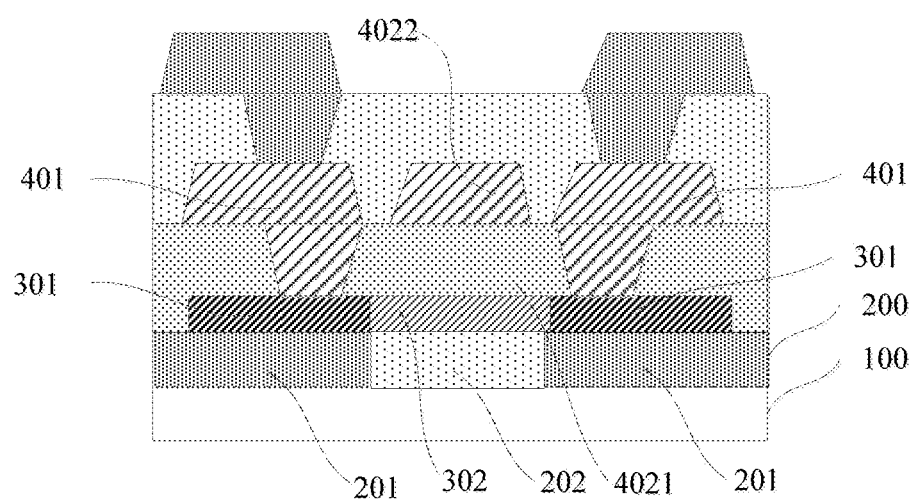
FIG. 15 is a cross-sectional view showing the TFT in one aspect of the present disclosure.

After the above-described process steps, a TFT as shown in FIG. 15 is obtained, including:

a hydrogen-containing buffer layer 200 formed on a substrate 100; an oxide semiconductor layer 300 formed on the buffer layer 200, and including a conductor region 301 and a semiconductor region 302; a source or drain 401 formed on the conductor region 302, and electrically connected to the conductor region 301; and a gate structure formed on the semiconductor region 302.

The hydrogen-containing buffer layer 200 includes a first hydrogen-containing region 201 corresponding to the conductor region 301 and a second hydrogen-free region 202 corresponding to the semiconductor region 302.

Optionally, a material of the first region 201 is different from that of the second region 202 to avoid hydrogen diffusion.

Optionally, the material of the first region 201 includes SiNx, and the material of the second region 202 includes SiOx.

Because SiNx is different from SiOx, the problems of diffusion of hydrogen to the second region and insufficient injection amount in the previous aspect are avoided. Moreover, a flattened SiOx material layer and SiNx material layer are in an aligned position, so that the problem of the segment gap in the first implementation manner will not be caused. Furthermore, compared to the prior art, the present disclosure has a simple manufacturing process, and avoids, in the manufacturing process, problems of surface defect of the oxide semiconductor layer 300 caused by plasma bombardment and of re-semiconducting the portion of the oxide semiconductor layer 300 having the conductor characteristics due to subsequent thermal treatment process.

Finally, in the optional embodiment, when the material of the first region includes SiNx, it needs not to be subjected to an additional hydrogen injection process, so the process steps can be reduced, meanwhile, the problem of insufficient hydrogen injection amount in the hydrogen injection process can be avoided.

In addition, in still another aspect of the present disclosure, the present disclosure provides an array substrate, which includes the TFT of any of the above aspects.

In addition, in yet another aspect of the present disclosure, the present disclosure provides a display panel including the array substrate as described above.

In addition, in still yet another aspect of the present disclosure, the present disclosure provides a display device, which is a product or component having any display function such as a liquid crystal television, a digital photo frame, a mobile phone, a tablet computer, and a navigator.

The terms "first", "second", and the like in the description, claims, and the above drawings of the present disclosure are used to distinguish different objects and not to describe a specific sequence. Further, the terms "including" and "comprising" and any variants thereof are intended to cover non-exclusive inclusions. For example, a process, a method, a system, a product, or a device that comprises a series of steps or units is not limited to the listed steps or units, but may optionally include steps or units that are not listed, or alternatively may also include inherent gas steps or units for the process, method or device.

Obviously, the above embodiments of the present disclosure are merely examples for clearly illustrating the present disclosure, and are not limitations to the embodiments of the present disclosure. For those skilled in the art, it is also possible to make other variations or changes in different forms based on the above description. Herein, it is not possible to exhaustively describe all of the embodiments. Any obvious changes or variations brought about by the technical solutions of the present disclosure shall fall into the protection scope of the present disclosure.

What is claimed is:
1. A thin film transistor, comprising:
  a substrate;
  a hydrogen-containing buffer layer, located on the substrate;
  an oxide semiconductor layer, located on the buffer layer, comprising a conductor region and a semiconductor region;

a source or drain, located on the conductor region, and electrically connected to the conductor region;

a gate structure, located on the semiconductor region; and a blocking layer, located between the buffer layer and the semiconductor region, and configured to block hydrogen in the buffer layer from entering into the semiconductor region, wherein the blocking layer is formed only in a region corresponding to the semiconductor region.

2. An array substrate, comprising the thin film transistor according to claim 1.

3. A display panel, comprising the array substrate according to claim 2.

4. A display device, comprising the display panel according to claim 3.

5. The TFT according to claim 1, wherein the hydrogen-containing buffer layer comprises a first region corresponding to the conductor region and a second region corresponding to the semiconductor region, and wherein the first region and the second region comprises SiNx and SiOx respectively.

6. A thin film transistor, comprising:

a substrate;

a hydrogen-containing buffer layer, located on the substrate;

an oxide semiconductor layer, located on the buffer layer, comprising a conductor region and a semiconductor region;

a source or drain, located on the conductor region, and electrically connected to the conductor region; and a gate structure, located on the semiconductor region, wherein the hydrogen-containing buffer layer comprises a first hydrogen-containing region corresponding to the conductor region and a second hydrogen-free region corresponding to the semiconductor region, and wherein the first hydrogen-containing region is formed only in a region corresponding to the conductor region.

7. An array substrate, comprising the thin film transistor according to claim 6.

8. A display panel, comprising the array substrate according to claim 7.

9. A display device, comprising the display panel according to claim 8.

* * * * *